(12) United States Patent
Takahashi et al.

(10) Patent No.: US 8,371,218 B2
(45) Date of Patent: Feb. 12, 2013

(54) LETTERPRESS PRINTING ORIGINAL PLATE FOR LASER ENGRAVING AND A LETTERPRESS PRINTING PLATE OBTAINED THEREFROM

(75) Inventors: Satoshi Takahashi, Okayama (JP); Atsushi Tatsuyama, Okayama (JP); Toru Wada, Okayama (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 416 days.

(21) Appl. No.: 12/810,048

(22) PCT Filed: Dec. 22, 2008

(86) PCT No.: PCT/JP2008/073306
§ 371 (c)(1),
(2), (4) Date: Jun. 22, 2010

(87) PCT Pub. No.: WO2009/081899
PCT Pub. Date: Jul. 2, 2009

(65) Prior Publication Data
US 2010/0269721 A1    Oct. 28, 2010

(30) Foreign Application Priority Data
Dec. 26, 2007   (JP) .................. 2007-333592

(51) Int. Cl.
*B41N 1/00*        (2006.01)
(52) U.S. Cl. ...................... 101/395; 430/306; 430/286.1
(58) Field of Classification Search .................. None
See application file for complete search history.

(56) References Cited

U.S. PATENT DOCUMENTS
5,798,202 A    8/1998   Cushner et al.

FOREIGN PATENT DOCUMENTS

| | | |
|---|---|---|
| GB | 2 085 905 | 5/1982 |
| JP | 57-056259 | 4/1982 |
| JP | 07-506780 | 7/1995 |
| JP | 2846954 | 10/1998 |
| JP | 11-170718 | 6/1999 |
| JP | 11-338139 | 12/1999 |
| JP | 2001-194781 | 7/2001 |
| JP | 2001-328365 | 11/2001 |
| JP | 2004-533343 | 11/2004 |
| JP | 2006-002061 | 1/2006 |
| WO | 93/23252 | 11/1993 |
| WO | 02/076739 | 10/2002 |

*Primary Examiner* — Joshua D Zimmerman
(74) *Attorney, Agent, or Firm* — Fish & Richardson P.C.

(57) ABSTRACT

To provide a photosensitive resin composition which is a material for a printing original plate for laser engraving which generates no printing deficiencies and from which a printing plate with a satisfactory resolution can be produced. A printing original plate for laser engraving where image is formed by irradiation of laser beam to form a printing plate, characterized in that the photosensitive resin composition layer consists of a photosensitive resin composition in which soluble polyamide or soluble polyether urethane urea, ethylenic unsaturated monomer and photopolymerization initiator are essential ingredients and the amount of (meth)acryloyl group in the photosensitive resin composition is 0.25 to 0.40 mol per 100 g of the photosensitive resin composition.

6 Claims, No Drawings

LETTERPRESS PRINTING ORIGINAL PLATE FOR LASER ENGRAVING AND A LETTERPRESS PRINTING PLATE OBTAINED THEREFROM

TECHNICAL FIELD OF THE INVENTION

The present invention relates to a letterpress printing original plate for laser engraving wherein image is formed by irradiation of laser beam to form a printing plate, and a letterpress printing plate obtained therefrom.

Letterpress printing plates to be used for various printing such as various kinds of printing packaging materials, sticker, label printing and the like have conventionally been produced by exposing a printing original plate made of a photosensitive resin to light imagewise to crosslink the resin in the exposed portion, and then washing off and removing the uncrosslinked resin in the unexposed portion. In recent years, however, printing plates produced by laser engraving have been spreading for the improvement in efficiency of printing plate production. In such printing plates, a relief image is formed directly on a printing original plate by the use of laser. In the process of producing a printing plate by laser engraving, projections and recesses are formed on the plate surface by decomposing an image-forming material in an irradiated portion through imagewise-irradiation of a printing original plate with a laser beam.

As to a printing original plate for laser engraving, technical application to flexographic plate is now in progress and a flexographic original plate for which laser engraving is possible or a flexographic plate prepared by laser engraving is disclosed in Patent Documents 1 and 2. In those documents, a monomer as a binder is mixed with an elastomeric rubber and the resulting flexographic printing original plate is cured by means of thermal cross-linking or optical cross-linking followed by subjecting to a laser engraving to give a flexographic printing plate. However, the resulting one is a flexographic printing plate suitable for aqueous ink or ester ink and is not suitable for the use as a resin letterpress plate where oily ink is mostly used.

On the other hand, as to a printing original plate for laser engraving to be used for letterpress printing, that which consists of a resin composition where a soluble polymer such as polyvinyl alcohol, modified polyvinyl alcohol or polyether polyamide is compounded with a photopolymerizing compound and a photopolymerization initiator is disclosed in Patent Documents 3 to 5.

However, as to a printing original plate for laser engraving to be used for letterpress printing, no printing original plate which satisfies both laser engraving property and printing property has been available. With regard to the problem in the laser engraving, the biggest one is that the resin dregs generated by irradiation of laser are not removed even by suction during the laser irradiation or by washing after the laser irradiation but are apt to remain being adhered to the plate. The resin dregs adhered to the non-irradiated area by laser (convex area) of the printing plate receive the ink during the printing whereby poor printing is apt to happen.

As to the above-mentioned problem of adherence of the resin dregs, there has been proposed a technique where mechanical characteristic of the printing original plate is enhanced by a method of compounding a colorless and transparent filler such as fine silica powder whereby tackiness and fusion of minute area are reduced (cf. Patent Document 6). However, according to a method where a filler such as fine silica powder is compounded, a lot of filler is necessary in order to sufficiently lower the tackiness of the printing original plate and there is a problem that molding property and plate property of the printing original plate are significantly deteriorated.

In the conventional method of adding a filler according to the prior art as such, molding property and plate property of the printing original plate receive a bad influence therefrom and, therefore, there has been a brisk demand for a printing original plate for laser engraving where tackiness of the printing original plate is able to be reduced and property of forming a minute area is enhanced without addition of a filler.

(Patent Documents)
1. Japanese Patent No. 2,846,954
2. Japanese Patent Application Laid-Open (JP-A) No. 338139/99
3. Japanese Patent Application Laid-Open (JP-A) No. 170718/99
4. Japanese Patent Application Laid-Open (JP-A) No. 2006-002061
5. Japanese Patent Application Laid-Open (JP-A) No. 2001-328365
6. Japanese Patent Application Laid-Open (JP-A) No. 2004-533343

DISCLOSURE OF THE INVENTION

Problem that the Invention is to Solve

The present invention was created in view of the present situation of such conventional technologies and an objective thereof is to provide a photosensitive resin composition for a letterpress printing original plate for laser engraving which generates no printing deficiencies and from which a printing plate with a satisfactory resolution can be produced, and a letterpress printing original plate for laser engraving obtained from said resin composition.

Means for Solving the Problem

The present inventors have earnestly investigated the composition of resin composition suitable for achieving the objective mentioned above. As a result, they have accomplished the present invention. Thus, the present invention relates to the followings. (1) A letterpress printing original plate for laser engraving where a photosensitive resin composition layer is cured by irradiation with ultraviolet ray and then image is formed by irradiation of laser beam to form a printing plate, characterized in that the photosensitive resin composition layer consists of a photosensitive resin composition in which soluble polyamide or soluble polyether urethane urea, ethylenic unsaturated monomer and photopolymerization initiator are essential ingredients and the amount of (meth)acryloyl group in the photosensitive resin composition is 0.25 to 0.40 mol per 100 g of the photosensitive resin composition; (2) the printing original plate for laser engraving according to (1), wherein the ethylenic unsaturated monomer has at least two acryloyl groups or methacryloyl groups and is contained in an amount of 50% to 70% in the photosensitive resin composition; (3) the printing original plate for laser engraving according to (1) or (2), wherein the ethylenic unsaturated monomer is a product by ring-opening addition reaction of polyglycidyl ether of polyhydric alcohol with methacrylic acid or with acrylic acid; (4) the printing original plate for laser engraving according to any one of (1) to (3), wherein the soluble polyamide is a basic nitrogen-containing copolymerized nylon or a polyether-containing polyamide; (5) the printing original plate for laser engraving according to any one of (1) to (3), wherein the soluble polyether urethane urea contains a basic nitrogen; and (6) a photosensitive resin letterpress printing plate which is characterized in being obtained from the printing original plate for laser engraving mentioned in any one of (1) to (5).

Advantages of the Invention

In the resin composition for a printing original plate capable of being laser-engraved of the present invention, soluble polyamide or soluble polyether urethane urea, ethylenic unsaturated monomer and photopolymerization initiator are essential ingredients and the amount of (meth)acryloyl group in the photosensitive resin composition is preferably 0.25 to 0.40 mol per 100 g of the photosensitive resin composition. In the present invention, by optimizing the amount of (meth)acryloyl group in the photosensitive resin composition so as to give a cross-linked state suitable for laser engraving, laser engraving dregs are able to be reduced and, at the same time, resin fusion upon the laser engraving is able to be suppressed. Therefore, the resin composition of the present invention has a very excellent property as a printing original plate for laser engraving.

Further in the present invention, by combining an ethylenic unsaturated monomer of a specific structure having a hydroxyl group in a molecule with a water-soluble polyamide, there is prepared an excellent printing original plate for laser engraving in which, even if resin dregs are adhered thereto, they are able to be easily removed by washing with water using, for example, a brush.

BEST MODE FOR CARRYING OUT THE INVENTION

In the present invention, the soluble polyamide means a polyamide which is homopolymer, copolymer or a mixture of two or more kinds thereof being synthesized from diamine with dicarboxylic acid or co-amino acid, lactam or a derivative thereof, etc. by a conventional process and is soluble in any solvent such as water, aqueous acid solution, lower aliphatic alcohol or a mixture thereof.

Specific examples of the soluble polyamide include various kinds of nylon (such as nylon 6, nylon 66, nylon 610, nylon 6/66/610 and nylon 6/66/612), polyamide synthesized from m-xylenediamine and adipic acid, copolymerized nylon with diaminodicyclohexylmethane, basic nitrogen-containing copolymerized nylon containing a constituting unit of N,N'-bis(3-aminopropyl) piperazine with adipic acid, etc., polyether-containing polyamide (such as copolymerized nylon with polyethylene glycol containing amino groups at both terminals and copolymerized nylon with polyethylene glycol containing carboxyl groups at both terminals) and N-methylolated product and N-alkoxymethylated product of various kinds of polyamides. Among these, basic polyether-containing polyamide are preferable.

As to a process for introducing a basic nitrogen into the basic nitrogen-containing copolymerized nylon used for the polyamide of the present invention, it is preferred to use a diamine having a basic tertiary nitrogen atom in the main chain or the side chain. A specific example of the preferred diamine includes a diamine having a piperazine ring such as N,N'-bis(aminomethyl)piperazine, N,N'-bis(2-aminoethyl)piperazine and N,N'-bis(3-aminopropyl)piperazine. Among these, N,N'-bis(3-aminopropyl)piperazine is particularly preferable.

Examples of the polyether used for the polyamide of the present invention include polyoxyalkylene glycol having a molecular weight of from 200 to 4,000, polyoxypropylene glycol having a molecular weight of from 200 to 4,000, and polytetramethylene glycol having a molecular weight of from 200 to 4,000, etc. and, in view of compatibility of repulsive elasticity with flexibility, polyethylene glycol having a molecular weight of 400 to 1,500 is preferred.

The soluble polyether urethane urea in the present invention is an additional polymer obtained by urethane bonding of diisocyanate to polyether and diamine having primary amino group or secondary amino group and having no amide bond in a skeleton, and is soluble in any solvent such as water, aqueous acid solution, lower aliphatic alcohol or a mixture thereof.

Specific examples of the diamine used for the soluble polyether urethane urea include ethylenediamine, diethylenediamine, trimethylenediamine, tetramethylenediamine, hexamethylenediamine, 2-methylpentamethylenediamine, undecamethylenediamine, dodecamethylenediamine, N,N'-bis(aminomethyl)piperazine, N,N'-bis(2-aminomethyl)piperazine, and N,N'-bis(3-aminopropyl)piperazine, etc. and a diamine in which 2-methylpentamethylenediamine and N,N'-bis(3-aminopropyl)piperazine are combined is particularly preferred since flexibility and solubility into a solvent such as alcohol of the polymer prepared therefrom are excellent. The diamine as such is also preferred in a case where the resin dregs adhered during the laser engraving are removed by a brush using water or a surfactant-containing water.

Examples of the polyether include polyoxyalkylene glycol having a molecular weight of from 200 to 4,000, polyoxypropylene glycol having a molecular weight of from 200 to 4,000, and polytetramethylene glycol having a molecular weight of from 200 to 4,000, etc. and, in view of compatibility of repulsive elasticity with flexibility, polyethylene glycol having a molecular weight of 400 to 1,000 is preferred. Each of those polyethers may be used solely or by mixing. As to the diisocyanate material used in the present invention, the use of any of known aliphatic, alicyclic and aromatic diisocyanates is possible. Specific examples thereof include 2,4-tolylene diisocyanate, 2,6-tolylene diisocyanate, 4,4'-diphenylmethanediisocyanate, 4,4'-dicyclohexylmethanediisocyanate, hexamethylene diisocyanate, dianisidineisocyanate, 3,3'-ditolylene-4,4'-diisocyanate, p-xylenediisocyanate, 1,3-cyclohexanedimethylisocyanate, and m-xylenediisocyanate, etc. and, in view of the flexibility of the resulting polymer, hexamethylene diisocyanate is particularly preferred.

Now, an illustration will be given for quaternization of a basic tertiary nitrogen atom in the soluble polyamide or polyether urethane urea used in the present invention. In order to remove the resin dregs, it is preferred that the basic nitrogen atom contained in the soluble polyamide or polyether urethane urea used in the present invention is quaternized.

A quaternizing agent used in the present invention is a protonic quaternizing agent and it may be either a quaternizing agent containing a photopolymerizing group which is optically polymerized by ultraviolet ray or a quaternizing agent containing no photopolymerizing group.

As to the protonic quaternizing agent containing a photopolymerizing group, a publicly known and common compound containing (meth)acryloyl group may be used. Specific examples of such a quaternizing agent include maleic acid, itaconic acid, acrylic acid, methacrylic acid and cinnamic acid, etc. and the particularly preferred ones are methacrylic acid and acrylic acid.

As to the protonic quaternizing agent, a publicly known and common compound may be used. Specific examples of the compound containing photopolymerizing agent include maleic acid, itaconic acid, acrylic acid, methacrylic acid and cinnamic acid, etc. and, in view of removal of the resin dregs, the preferred ones are methacrylic acid and acrylic acid. On the other hand, specific examples of the compound containing no photopolymerizing agent include glycolic acid, lactic acid, succinic acid, and adipic acid as an example of the aliphatic quaternizing agent and benzoic acid as an example of an aromatic quaternizing agent and, in view of removal of the resin dregs, adipic acid and lactic acid are preferred.

As to the ethylenic unsaturated monomer used in the present invention, a publicly known and common compound containing a (meth)acryloyl group may be used and, among that, a compound having two or more acryloyl groups or methacryloyl groups and further having one or more hydroxyl group(s) is preferred. As to the advantageously used ethylenic unsaturated monomer, a product by ring-opening addition reaction of polyglycidyl ether of polyhydric alcohol with methacrylic acid or acrylic acid may be listed and examples of the polyhydric alcohol include dipentaerythritol, pentaerythritol, trimethylolpropane, glycerin, ethyleneglycol, diethyleneglycol, triethyleneglycol and an ethylene oxide adduct of phthalic acid. In the present invention, a product by ring-opening addition reaction of polyglycidyl ether of polyhydric alcohol with methacrylic acid or acrylic acid is used whereby it is now possible that, since the ring-opening addition reaction product contains a hydroxyl group, it has an excellent compatibility with the soluble polyamide and, in addition, the resin dregs adhered upon a laser engraving are also able to be easily removed by water or a solvent where water is a main component.

In the present invention, it is important that the amount of the (meth)acryloyl group in the photosensitive resin composition is made within a specific range so as to satisfy the laser engraving property and it is necessary that the amount of the (meth)acryloyl group in the photosensitive resin composition is 0.25 to 0.40 mol per 100 g of the photosensitive resin composition.

When the amount of the (meth)acryloyl group per 100 g of the photosensitive resin composition is less than 0.25 mol, tackiness of the photosensitive resin is too high whereby the adhered amount of the resin dregs is abundant while, when it is more than 0.40 mol, hardness of the printing plate becomes too high whereby the problem of lowering the ink spread is resulted and that is not preferred.

It is also important in the present invention that the compounding amount (% by weight) of the ethylenic unsaturated monomer to the photosensitive resin composition is made within a specific range and it is preferred that the ethylenic unsaturated monomer has at least two acryloyl groups or methacryloyl groups and further that said monomer is contained in the photosensitive resin composition to an extent of 50% by weight to 70% by weight. When the amount of the ethylenic unsaturated monomer in the photosensitive resin composition is less than 50% by weight, the ratio of the ethylenic unsaturated monomer to the nylon resin is too low whereby the optical cross-linking network structure is insufficient and, even in the photosensitive resin after optical cross-linking, tackiness upon laser engraving is high and the adhered amount of the resin dregs becomes high. On the other hand, when the amount of the ethylenic unsaturated monomer in the photosensitive resin composition is more than 70% by weight, the printing original plate hardly becomes a solid whereby the handling property becomes poor in the steps until the curing by ultraviolet ray and the product is unable to be used as a printing original plate for laser engraving.

Accordingly, the most preferred form in terms of the photo-curing is that the amount of the (meth)acryloyl group in the photosensitive resin composition is 0.25 to 0.40 mol per 100 g of the photosensitive resin composition and further that the amount of the ethylenic unsaturated monomer is 50% by weight to 70% by weight.

With regard to a method where the amount of the (meth)acryloyl group in the photosensitive resin composition is made 0.25 to 0.40 mol per 100 g of the photosensitive resin composition and also the amount of the ethylenic unsaturated monomer is made from 50% by weight to 70% by weight, when the distance (molecular weight) between the (meth)acryloyl group and the (meth)acryloyl group in the ethylenic unsaturated monomer is changed, then it is possible to increase or to decrease the amount of the (meth)acryloyl group in the photosensitive resin composition in spite of the fact that the compounding amount to the photosensitive resin composition is the same.

Examples of the photopolymerization initiator include benzophenones, benzoins, acetophenones, benzyls, benzoin alkyl ethers, benzoin alkyl ketals, anthraquinones and thioxanthones. Specific examples include benzophenone, chlorobenzophenone, benzoin, acetophenone, benzyl, benzoin methyl ether, benzoin ethyl ether, benzoin isopropyl ether, benzoin isobutyl ether, benzyl dimethyl ketal, benzyl diethyl ketal, benzyl diisopropyl ketal, anthraquinone, 2-ethyl anthraquinone, 2-methyl anthraquinone, 2-allyl anthraquinone, 2-chloroanthraquinone, thioxanthone, and 2-chlorothioxanthone.

In the photosensitive resin composition of the present invention, it is possible to compound a publicly known thermal polymerization inhibitor for enhancing the stability during the manufacture or during the preservation. Specific examples of the thermal polymerization inhibitor include phenols, hydroquinones, catechols and phenothiazines. Besides the above, it is also possible to add plasticizer, dye, pigment, ultraviolet absorber, perfume, etc.

A conventionally known resin molding method can be used as the method for molding the resin composition of the present invention into a sheet-like or tubular form. For example, a method can be mentioned which includes the application of the resin composition of the present invention onto an appropriate support or a cylinder of a printer, followed by pressurizing with a heat pressing machine, or the like. As the support, a material is preferably used which has flexibility and is excellent in dimension stability. Examples thereof include a plastic film such as a polyethylene terephthalate film, a polyethylene naphthalate film, a polybutylene terephthalate film, and a polycarbonate film, and a metal plate or a metallized film such as steel, stainless steel and aluminium. The thickness of the support may appropriately be selected according to the use. Further, if necessary, in order to improve the adhesion between the support and the photosensitive resin layer, a known adhesive may be provided which has heretofore been used for this kind of purpose on the surface of the support. The condition of the pressurization is preferably about 20 to 200 kg/cm$^2$. The temperature condition in the pressurization is preferably about room temperature to about 150° C. While the thickness of a molded article to be formed may be determined appropriately according to the size, property etc. of a printing original plate to be produced and is not specifically limited, it is ordinarily about 0.1 to about 10 mm.

The molded resin composition is subsequently irradiated with light, so that the ethylenic unsaturated monomer in the resin composition is polymerized and crosslinked and whereby the molded article is cured to form a printing original plate. Examples of the light source to be used for the curing include such as a high-pressure mercury lamp, an ultrahigh-pressure mercury lamp, an ultraviolet fluorescent lamp, a carbon-arc lamp and a xenon lamp. Also, the curing can be performed by any conventionally known method other than the above. While only a single type of light source may be used as the light source for the curing, the curability of the resin may increase when curing is performed by the use of two or more types of light sources which differ from each other in wavelength. Therefore, two or more types of light sources may be used.

The printing original plate thus obtained is mounted on the surface of a plate-mounting drum of a laser engraving device. By imagewise-laser irradiation, the original plate of the irradiated portion is decomposed to form a recessed portion and a printing plate is produced.

EXAMPLE 1

ε-Caprolactam (55.0 parts), 40.0 parts by weight of a nylon salt of adipic acid and N,N'-bis(3-aminopropyl)piperazine and 7.5 parts by weight of a nylon salt of adipic acid and 1,3-bisaminomethylcyclohexane were subjected to a melt polycondensation to give a copolymerized amide.

The resulting polyamide (42.0 parts) was dissolved in 100.0 parts of methanol and 20 parts of water at 60° C. for 2 hours in a heating and dissolving reactor equipped with a stirrer and then 2.4 parts of lactic acid, 54.5 parts of an adduct of trimethylolpropane triglycidyl ester with methacrylic acid, 0.1 part of hydroquinone monoethyl ether and 1.0 part of benzyl dimethyl ketal were added thereto to give a photosensitive resin composition solution. This solution was flown into a culture dish coated with Teflon™ and methanol was removed therefrom in a dark room followed by drying in vacuo at 40° C. for the whole day and night to give a composition sheet having a thickness of 800 μm.

Amount of the methacryloyl group per 100 g of the resulting composition was 0.29 mol.

Then, the resulting composition sheet was sandwiched between a film composed of a polyethylene terephthalate film having a thickness of 250 μm coated with a polyester-based adhesive layer and a polyethylene terephthalate film having a thickness of 100 μm, and then pressed with a heat pressing machine at 100° C. at a pressure of 100 kg/cm$^2$, thereby obtaining a sheet-like molded material having a thickness of 1.05 mm. Subsequently, both sides of this sheet-like molded material were exposed to light for ten minutes using an UV exposure machine (light source: 10R manufactured by Koninklijke Philips Electronics) to crosslink and cure, and then the polyethylene terephthalate film having a thickness of 125 μm was removed, thereby producing a printing original plate.

EXAMPLE 2

The same operation as in Example 1 was carried out except that an adduct of trimethylolpropane triglycidyl ester with acrylic acid was used as the ethylenic unsaturated monomer whereupon a printing original plate was prepared. Amount of the acryloyl group per 100 g of the resulting composition was 0.32 mol.

EXAMPLE 3

The same operation as in Example 1 was carried out except that the amount of the polyamide was made 46.5 parts and 50 parts of an adduct of trimethylolpropane triglycidyl ester with acrylic acid was used as the ethylenic unsaturated monomer whereupon a printing original plate was prepared. Amount of the acryloyl group per 100 g of the resulting composition was 0.29 mol.

EXAMPLE 4

The same operation as in Example 1 was carried out except that the amount of the polyamide was made 31.8 parts and 65 parts of an adduct of trimethylolpropane triglycidyl ester with acrylic acid was used as the ethylenic unsaturated monomer whereupon a printing original plate was prepared. Amount of the acryloyl group per 100 g of the resulting composition was 0.38 mol.

EXAMPLE 5

The same operation as in Example 1 was carried out except that O-diglycidyl phthalate ether acrylate was used as the ethylenic unsaturated monomer whereupon a printing original plate was prepared. Amount of the acryloyl group per 100 g of the resulting composition was 0.31 mol.

EXAMPLE 6

15 parts by weight of ε-caprolactam, 20 parts by weight of a nylon salt of adipic acid and hexamethylenediamine, and 600 parts by weight of a nylon salt of adipic acid and diaminopolyethyleneglycol (average molecular weight=1,000) were subjected to a melt polycondensation to give a polyether amide. The resulting polyether amide (38.4 parts) was dissolved in 200 parts of ethanol and 10 parts of water and then 60.0 parts of an adduct of trimethylolpropane triglycidyl ester with acrylic acid, 0.1 part of hydroquinone monoethyl ether and 1.5 part of benzyl dimethyl ketal were added thereto to give a photosensitive resin composition solution. This solution was processed into sheet with the same operation as in Example 1, thereby producing a printing original plate. Amount of the acryloyl group per 100 g of the resulting composition was 0.35 mol.

EXAMPLE 7

The same operation as in Example 1 was carried out except that the amount of the polyamide was made 46.5 parts and 29 parts of an adduct of trimethylolpropane triglycidyl ester with acrylic acid and 21 parts of tetramethylolmethane triacrylate were used as the ethylenic unsaturated monomer whereupon a printing original plate was prepared. Amount of the acryloyl group per 100 g of the resulting composition was 0.38 mol.

EXAMPLE 8

A urethane oligomer (353 parts) having isocyanate groups substantially at both terminals prepared by the reaction of 500 parts of polyethylene glycol (average molecular weight=1,000) with 185 parts of hexamethylene diisocyanate was gradually added, with stirring, to a diamine solution prepared by dissolving 87 parts of N,N'-bis(3-aminopropyl)piperazine in 600 parts of methanol. Reaction of the both finished within about 10 minutes. This solution was taken into a culture dish coated with Teflon™ and methanol was removed therefrom by evaporation followed by drying in vacuo to give polyether urethane urea. The same operation as in Example 1 was carried out except that resulting polyether urethane urea was used instead of polyamide in Example 1 whereupon a printing original plate was prepared. Amount of the methacryloyl group per 100 g of the resulting composition was 0.29 mol.

COMPARATIVE EXAMPLE 1

The same operation as in Example 1 was carried out except that the amount of the polyamide was made 55 parts and 41.5 parts of an adduct of trimethylolpropane triglycidyl ester with acrylic acid was used whereupon a printing original plate was prepared. Amount of the acryloyl group per 100 g of the resulting composition was 0.24 mol.

COMPARATIVE EXAMPLE 2

The same operation as in Example 1 was carried out except that the amount of the polyamide was made 21.5 parts and 75.0 parts of an adduct of trimethylolpropane triglycidyl ester with methacrylic acid was used whereupon a photosensitive resin composition solution was prepared. Amount of the acryloyl group per 100 g of the resulting composition was 0.43 mol. This solution was flown into a culture dish coated with Teflon™ in the same way as in Example 1 and methanol was evaporated therefrom. However, solidification was not sufficient and no sheet was resulted whereby no printing original plate was achieved.

COMPARATIVE EXAMPLE 3

The same operation as in Example 1 was carried out except that the amount of the polyamide was made 48.5 parts and 47.0 parts of glycerin dimethacrylate was used as the ethylenic unsaturated monomer whereupon a printing original plate was prepared. Amount of the methacryloyl group per 100 g of the resulting composition was 0.42 mol.

Next, the printing original plates produced in Examples and Comparative Examples were wound with a double-sided tape on a plate-mounting drum of a laser engraving device, followed by laser engraving under the conditions shown below. A dust collector located near a laser gun was operated simultaneously with the start of the laser engraving, thereby discharging the engraved resin dregs out of the device continuously. After the laser engraving, the plates were dismounted from the mounting drum and were washed with running water using a brush to remove a small amount of resin dreg on the surface of the plates. The plates were then dried to obtain printing plates.

The laser engraving device used was a FlexPose! direct equipped with a 300 W carbon dioxide laser, manufactured by Luescher Flexo. The specifications of the device included a laser wavelength of 10.6 μm, a beam diameter of 30 μm, a plate-mounting drum diameter of 300 mm and a processing rate of 1.5 hours/0.5 $m^2$. The conditions of the laser engraving are as follows. Here, (1) to (3) are conditions inherent to the device. For conditions (4) to (7), which may be set arbitrarily, standard conditions of the device were adopted, respectively.

(1) Resolution: 2540 dpi
(2) Laser pitch: 10 μm
(3) The number of drum rotations: 982 cm/sec.
(4) Top power: 9%
(5) Bottom power: 100%
(6) Shoulder width: 0.30 mm
(7) Evaluated image: 150 lpi, screen dots at every 1% from 0 to 100%

The printing plates obtained were investigated for the following evaluation items.

(1) Condition of Resin Dreg Adhesion to the Surface of a Printing Plate

Using a magnifying lens of 10 magnifications, the condition of resin dreg adhesion to the surface of a printing plate was inspected visually and was expressed in the following four levels: oo almost no resin dreg was found; o a little resin dreg was found; Δ a considerable amount of resin dreg was found; x a great amount of resin dreg was found.

(2) Reproduction of Minimum Screen Dot at 150 lpi

The reproduction of minimum screen dot at 150 lpi was measured using a magnifying lens of 10 magnifications.

(3) Depth of 10% Screen Dot at 150 lpi

The depth of 10% screen dot at 150 lpi was measured using an ultra-deep color 3D profile measuring microscope (VK-9510 manufactured by KEYENCE CORPORATION).

(4) Printability

Printability was evaluated by conducting a printing of the obtained relief by using a letterpress printer.

o: Any of highlight, shadow and solid parts is able to be clearly printed.

Δ: In any of highlight, shadow and solid parts, a slightly unclear area was noted.

x: In any of highlight, shadow and solid parts, an unclear area was noted.

The evaluation results are shown in Table 1.

It is noted from the result of the evaluation of Table 1 that adhesion of the resin dregs is little, a printing plate where reproducibility of the minute screen dots is good and screen dot depth is deep is able to be produced in the case of Examples 1 to 8 where the soluble polyamide or the soluble polyether urethane urea is used and the amount of (meth) acryloyl group per 100 g of the composition is 0.25 to 0.40 mol. When the resulting plate is subjected to a printing using a letterpress printer, a clear printing is possible. On the contrary, in Comparative Example 1 where the amount of (meth) acryloyl group per 100 g of the composition is 0.24 mol, resolving degree and printability are inferior. Further, in Comparative Example 2 where not less than 75 parts by weight of an ethylenic unsaturated monomer is contained, the photosensitive resin composition is not solidified whereby trouble is resulted for the preparation of a printing original plate. From the above results, it is now apparent that, when the resin composition of the present invention is used, adhesion of the resin dregs generated by irradiation of laser is able to be effectively suppressed and that, according to the present invention, a printing plate having excellent resolving degree and excellent printability is able to be manufactured.

TABLE 1

|  |  | Example 1 | Example 2 | Example 3 | Example 4 | Example 5 | Example 6 |
|---|---|---|---|---|---|---|---|
| Composition of photosensitive resin | Basic nitrogen-containing copolymerized nylon (% by weight) | 42.0 | 42.0 | 46.5 | 31.8 | 42.0 | |
| | Polyether amide (% by weight) | | | | | | 38.4 |
| | Polyether urethane urea (% by weight) | | | | | | |
| | Ethylenic unsaturated monomer containing rate (% by weight) | 54.5 | 54.5 | 50.0 | 65.0 | 54.5 | 60.0 |
| | Mol amount of the (meth)acryloyl group per 100 g of the resulting composition | 0.29 | 0.32 | 0.29 | 0.38 | 0.31 | 0.35 |

TABLE 1-continued

| | | | | | | | |
|---|---|---|---|---|---|---|---|
| Evaluation items | Solidification ability of the printing original plate | ⊙⊙ | ⊙⊙ | ⊙⊙ | ○ | ○ | ○ |
| | Condition of resin dreg adhesion to the surface of a printing plate | ⊙⊙ | ⊙⊙ | ⊙⊙ | ⊙⊙ | ○ | ○ |
| | Reproduction of minimum screen dot at 150 lpi | 1% | 1% | 1% | 1% | 1% | 1% |
| | Depth of 10% screen dot at 150 lpi | 75 μm | 72 μm | 72 μm | 74 μm | 68 μm | 76 μm |
| | Printability | ○ | ○ | ○ | ○ | ○ | ○ |

| | | Example 7 | Example 8 | Comparative Example 1 | Comparative Example 2 | Comparative Example 3 |
|---|---|---|---|---|---|---|
| Composition of photo-sensitive resin | Basic nitrogen-containing copolymerized nylon (% by weight) | 46.5 | | 55.0 | 21.5 | 48.5 |
| | Polyether amide (% by weight) | | | | | |
| | Polyether urethane urea (% by weight) | | 42.0 | | | |
| | Ethylenic unsaturated monomer containing rate (% by weight) | 50.0 | 54.5 | 41.5 | 75.0 | 48.0 |
| | Mol amount of the (meth)acryloyl group per 100 g of the resulting composition | 0.38 | 0.29 | 0.24 | 0.43 | 0.42 |
| Evaluation items | Solidification ability of the printing original plate | ○ | ⊙⊙ | ⊙⊙ | x | ○ |
| | Condition of resin dreg adhesion to the surface of a printing plate | ○ | ⊙⊙ | Δ | — | x |
| | Reproduction of minimum screen dot at 150 lpi | 1% | 1% | 5% | — | 5% |
| | Depth of 10% screen dot at 150 lpi | 73 μm | 74 μm | 43 μm | — | 48 μm |
| | Printability | ○ | ○ | x | — | x |

Industrial Applicability

According to the resin composition of the present invention, almost no resin dreg produced by laser irradiation in the preparation of a printing plate is allowed to be left adhered to the surface of the plate. Therefore, the resin composition of the present invention can be used suitably for manufacturing a printing original plate for laser engraving, especially in the field of letterpress printing.

What is claimed is:

1. A letterpress printing original plate for laser engraving where a photosensitive resin composition layer is cured by irradiation with ultraviolet ray and then image is formed by irradiation of laser beam to form a printing plate, characterized in that the photosensitive resin composition layer consists of a photosensitive resin composition in which soluble polyamide or soluble polyether urethane urea, ethylenic unsaturated monomer and photopolymerization initiator are essential ingredients and the amount of (meth)acryloyl group in the photosensitive resin composition is 0.25 to 0.40 mol per 100 g of the photosensitive resin composition.

2. The printing original plate for laser engraving according to claim 1, characterized in that the ethylenic unsaturated monomer has at least two acryloyl groups or methacryloyl groups and is contained in an amount of 50% to 70% in the photosensitive resin composition.

3. The printing original plate for laser engraving according to claim 1, characterized in that the ethylenic unsaturated monomer is a product by ring-opening addition reaction of polyglycidyl ether of polyhydric alcohol with methacrylic acid or with acrylic acid.

4. The printing original plate for laser engraving according to claim 1, characterized in that the soluble polyamide is a basic nitrogen-containing copolymerized nylon or a polyether-containing polyamide.

5. The printing original plate for laser engraving according to claim 1, characterized in that the soluble polyether urethane urea contains a basic nitrogen.

6. A photosensitive resin letterpress printing plate, characterized in being obtained from the printing original plate for laser engraving according to claim 1.

* * * * *